United States Patent
Zambrano et al.

[19]

[11] Patent Number: 6,093,948
[45] Date of Patent: *Jul. 25, 2000

[54] MOS TRANSISTORS HAVING VERTICAL CURRENT FLOW

[75] Inventors: Raffaele Zambrano, Mercato san Severino; Carmelo Magro, Catania, both of Italy

[73] Assignees: Consorzio per la Ricerca Sulle Microelettronica nel Mezzogiorno; STMicroelectronics, s.r.l., both of Italy

[*] Notice: This patent is subject to a terminal disclaimer.

[21] Appl. No.: 08/286,638

[22] Filed: Aug. 5, 1994

Related U.S. Application Data

[62] Division of application No. 08/066,336, May 21, 1993, which is a continuation of application No. 07/774,454, Oct. 10, 1991, abandoned.

[30] Foreign Application Priority Data

Oct. 16, 1990 [EP] European Pat. Off. ............. 90830462

[51] Int. Cl.$^7$ ................................................. H01L 29/76
[52] U.S. Cl. ......................... 257/339; 257/335; 257/336; 257/401
[58] Field of Search ................................... 257/401, 335, 257/336, 337, 338, 339, 340, 341, 327, 346, 342, 344, 142, 144

[56] References Cited

U.S. PATENT DOCUMENTS

| | | | |
|---|---|---|---|
| 4,345,265 | 8/1982 | Blanchard | 257/336 |
| 4,587,713 | 5/1986 | Goodman et al. | 257/335 |
| 4,672,407 | 6/1987 | Nakagawa et al. | 257/142 |
| 4,803,532 | 2/1989 | Mihara | 257/335 |
| 4,860,072 | 8/1989 | Zommer | 257/144 |
| 4,974,059 | 11/1990 | Kinzer | 257/342 |
| 5,057,884 | 10/1991 | Suzuki et al. | 257/144 |
| 5,160,985 | 11/1992 | Akiyama | 257/145 |
| 5,198,688 | 3/1993 | Tsuchiya et al. | 257/144 |

FOREIGN PATENT DOCUMENTS 000387722  9/1990  European Pat. Off. ............... 257/335

OTHER PUBLICATIONS

S.M. Sze; "Semiconductor Devices Physics and Technology"; 1985; pp 110–111.

*Primary Examiner*—Tom Thomas
*Assistant Examiner*—Ori Nadav
*Attorney, Agent, or Firm*—Felsman, Bradley, Vaden, Gunter & Dillon, LLP

[57] ABSTRACT

The process provides first for the accomplishment of low-doping body regions at the sides and under a gate region and then the accomplishment of high-doping body regions inside said low-doping body regions and self-aligned with said gate region. There is thus obtained an MOS power transistor with vertical current flow which has high-doping body regions self-aligned with said gate region and with a reduced junction depth.

23 Claims, 4 Drawing Sheets

MOS TRANSISTORS HAVING VERTICAL CURRENT FLOW

This is a Division, of application Ser. No. 08/066,336, filed May 21, 1993, which is a continuation of Ser. No. 07/774,454 Oct. 10, 1991 abandoned.

BACKGROUND OF THE INVENTION

1. Field of the Invention

The present invention relates to a process for fabricating MOS semiconductor devices, and more particularly for fabricating power MOS transistors with a vertical current flow, and to the resulting structures.

2. Description of the Prior Art

It is known in the art to form n-channel and p-channel power MOSFET devices. These devices are typically doubly-diffused MOS devices with a vertical current flow (VDMOS), and may be fabricated as discrete devices or incorporated into integrated circuits having other devices, such as a control circuit combined with a power stage.

In general, one known technique for forming such power devices includes growing a lightly doped epitaxial layer of a first conductivity type on a heavily doped silicon substrate which is also doped with the first conductivity type. Standard field oxidation and masking steps are performed, followed by implantation and diffusion of a highly doped region of a second conductivity type in the epitaxial layer. Active areas are then defined on the device using a masking step, followed by the formation of gate oxide and polycrystalline silicon layers. The polycrystalline and gate oxide layers are then masked and etched to define a gate. A lightly doped region of the second conductivity type is then formed at the sides of, and underneath, the gate for the formation of a channel region. Highly doped regions of the first conductivity type are formed adjacent to the gate to provide source regions. Later steps include the deposition of oxide over the polycrystalline silicon, definition of contact areas and metallization of the entire surface over the device, and passivation of the device. Metallization is provided for the backside of the substrate to create a drain.

Formation of power MOS devices in such a manner results in the formation of bipolar parasitic transistors on each side of the gate region. In the case of an n-channel power transistor, the parasitic bipolar transistor is an NPN transistor. The emitter of the parasitic bipolar transistor is formed by the source region, the body region forms the base, and the epitaxial layer is the collector of the parasitic device.

The metallization formed over the surface of the MOS transistor causes the base and emitter of the parasitic transistor to be substantially short circuited. The short circuit is somewhat limited by the internal resistances of the device between the surface of the power transistor and the body region under the source. This resistance constitutes the base extrinsic resistance of the parasitic transistor.

These resistances are lower in the highly doped body regions, where the high doping levels cause an increase in carrier recombinations and diminish the possibility of current flowing from the emitter to the collector. The gain of the parasitic transistor is also low in such highly doped regions. The base resistance, and transistor gain, have higher values in the body regions having lower dopant concentrations.

The importance of having low gain and low resistances for the parasitic transistors may be observed by realizing that whenever the rate of variation of the voltage applied across the MOS transistor is sufficiently high, capacitance current flowing through the extrinsic base resistance of the parasitic transistor base can bias it on and cause it to switch into operation in the active region. This causes the power transistor to have a breakdown voltage equal to that of the parasitic transistor with its base not short circuited to the emitter, which is obviously lower than otherwise typical of the power MOS transistor.

Therefore, the presence of the parasitic bipolar transistors has the effect of lowering the breakdown voltage of the power MOS transistor, and of reducing the switching speed of such device. A lower gain and base extrinsic resistance for the parasitic bipolar transistors results in a higher voltage rate of change required to turn on the parasitic bipolar device. This result in an improved VDMOS device.

Known prior art power devices have a number of important drawbacks. Two distinct masking steps are typically used to define a channel region and a highly doped body region. One result of using two masks is a possibility of misalignment between the highly doped body region and the polycrystalline silicon gate structure. It is possible for the highly doped body region to penetrate into the channel region, where the increase of dopant causes a rise the conduction threshold voltage of the transistor. Also, the source-drain resistance of the device increases during transistor conduction.

A further drawback of the prior art results from the greater junction depth of the highly doped body region with respect to a lower doped body region. During device conduction, the source-drain resistance rises as the epitaxial layer thickness increases. The breakdown voltage is controlled by the minimum thickness of the epitaxial layer under the body region, and is therefore lower for an increase in junction thickness in the highly doped body region. Such a disparity in results does not allow for optimization of the source-drain resistance for a given breakdown voltage.

SUMMARY OF THE INVENTION

It is therefore an object of the present invention to provide a process for fabricating power MOS transistors with vertical current flow which overcomes the drawbacks mentioned above.

Therefore, in accordance with the present invention, a lesser doped epitaxial region is grown on a more heavily doped substrate. Both the substrate and epitaxial layers are doped to have a first conductivity. After formation of a gate oxide and gate electrode, lightly doped regions of a second conductivity type are formed within the epitaxial layer. Sidewall spacers are then formed along side the gate electrode, and highly doped body regions of the second conductivity type are formed within the lightly doped body regions. These highly doped body regions are self-aligned with the gate because of the sidewall spacers. Source regions may be formed in the epitaxial layer along side the gate electrode either before formation of the sidewall spacers or after removing them after forming the highly doped body regions.

BRIEF DESCRIPTION OF THE DRAWINGS

The features of the present invention shall be better understood by making reference, merely as a nonlimiting example, to the enclosed drawings, wherein.

DESCRIPTION OF THE PREFERRED EMBODIMENT

In general outline, the invention is directed to a process for forming power MOS transistors having vertical current flow. A preferred method includes the steps of growing an epitaxial layer on a silicon substrate. The epitaxial layer is a lesser doped layer of a first conductivity type and the substrate is more highly doped and also of the first conductivity type. Steps of field oxidation, masking for definition of active areas on the surface of the epitaxial layer, growth of a gate oxide, and deposition of a polycrystalline layer are then performed. The polycrystalline silicon layer is preferably highly doped of the first conductivity type. Masking and etching steps are performed on the polycrystalline silicon and gate oxide layers to define a gate region. Dopant of a second conductivity type is then implanted and diffused into the epitaxial layer to create a lightly doped body region along side and under the gate region. Sidewall spacers are then formed along side the gate region, and highly doped regions of the second productivity type are then implanted and diffused. The sidewall spacers are then removed.

Source regions are formed over the highly doped body regions by implantation and diffusion. This may be done after the sidewall spacers have been removed, or alternatively by implantation before the sidewall spacers are formed. In the latter alternative, the subsequent diffusion is performed simultaneously, that of the highly doped body region.

Finally, standard processing steps are performed, including deposition of insulating oxide over the polycrystalline silicon gate region, definition of contact areas, and deposition of metal on the front and rear of the substrate and a passivating glass layer on the top of the front metal.

The resulting structure consists of a transistor having a highly doped silicon substrate with an epitaxial layer on top. Lightly doped body regions, highly doped body regions, and source regions are formed in the epitaxial layer adjacent to a polycrystalline silicon gate structure. The highly doped body regions are contained inside the lightly doped body regions, and are self-aligned with a gate region.

Among others, the following advantages are obtained by using the process just described:

A. the alignment of the highly doped body regions with the gate region minimizes simultaneously the base extrinsic resistance and the gain of the bipolar parasitic transistor associated with the power transistor;

B. the junction depth of the highly doped body regions is less than that of the lightly doped body regions since they are formed at a later time. This minimizes the thickness of the epitaxial layer, and therefore the resistance of the power device during conduction;

C. elimination of a masking step for forming the highly doped regions simplifies processing and reduces production cost.

Figure 1:
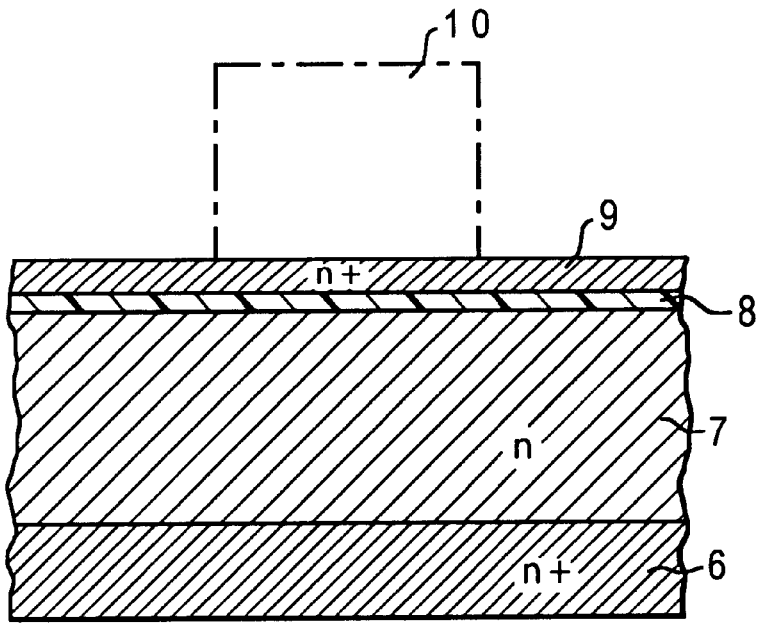
FIGS. 1–5 illustrate successive steps of the process according to the present invention.

A preferred processing sequence is illustrated in FIGS. 1–5. Referring to FIG. 1, a power MOS n-channel transistor with vertical current flow is to be formed on a silicon substrate 6 having n+ doping. Substrate region 6 may be doped using, for example, antimony. An epitaxial layer 7 is formed on the substrate 6, and is doped n-type. After field oxidation and definition of active areas, a gate oxide layer 8 is grown on the epitaxial layer 7 and followed by deposition of a polycrystalline silicon layer 9. After the polycrystalline silicon 9 is doped n+, it will be used to form the power transistor's gate.

Figure 2:
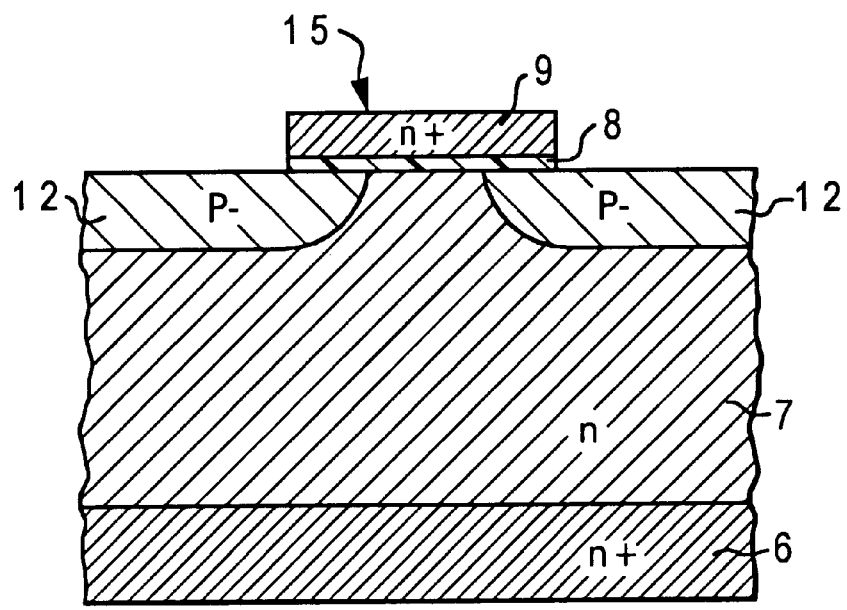

A photoresist mask 10 is used to define the gate region. Referring to FIG. 2, the polycrystalline silicon layer 9 and oxide layer 8 are etched using the resist mask to define a gate region 15. A p-type dopant, for example boron, is implanted and diffused into the epitaxial layer 7 to form lightly doped body regions 12.

Figure 3:
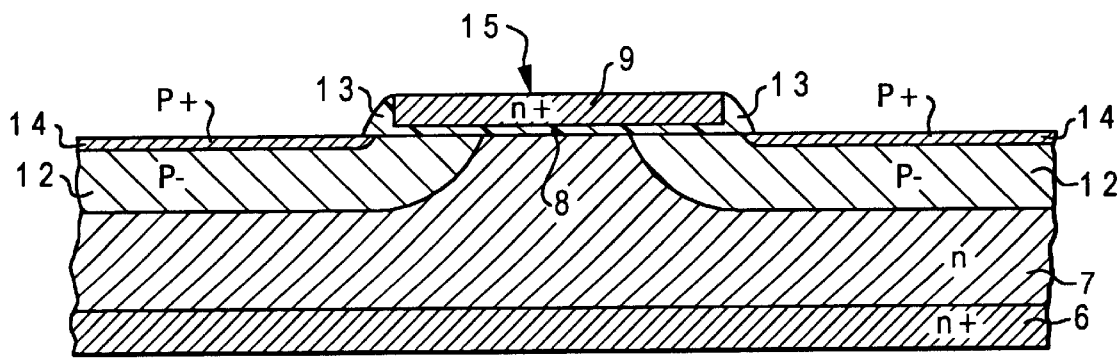

Referring to FIG. 3, spacers 13, of oxide or other appropriate material, are formed along the sides of the polycrystalline layer 9. A p+ dopant is then implanted and diffused to create highly doped body regions 14. The regions 14 are self-aligned with the gate 15 and are wholly contained within the lightly doped body regions 12.

Figure 4:
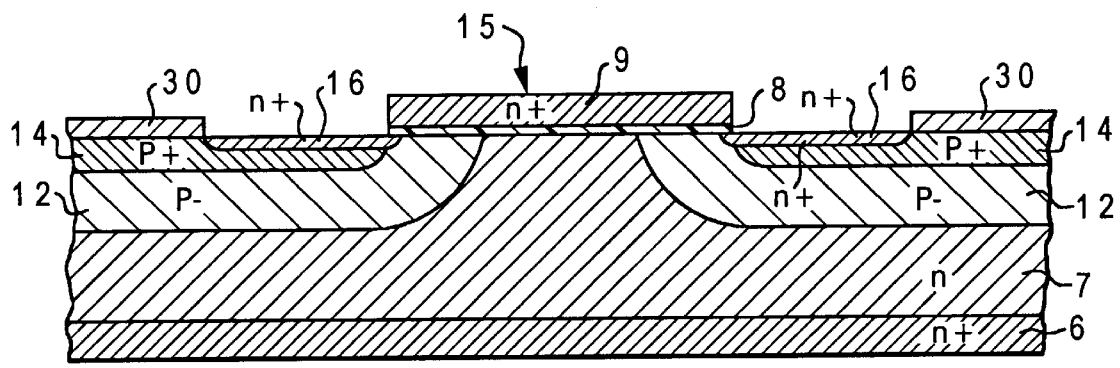

Referring to FIG. 4, the spacers 13 are removed and an oxide layer 30 is grown over the device. Oxide layer 30 is patterned so that it does not cover the gate electrode 15 or the immediately adjacent areas. A dopant such as arsenic is then implanted and diffused into the epitaxial layer 7 to create n+ source region 16. Oxide layer 30 is then preferably removed.

Figure 5:
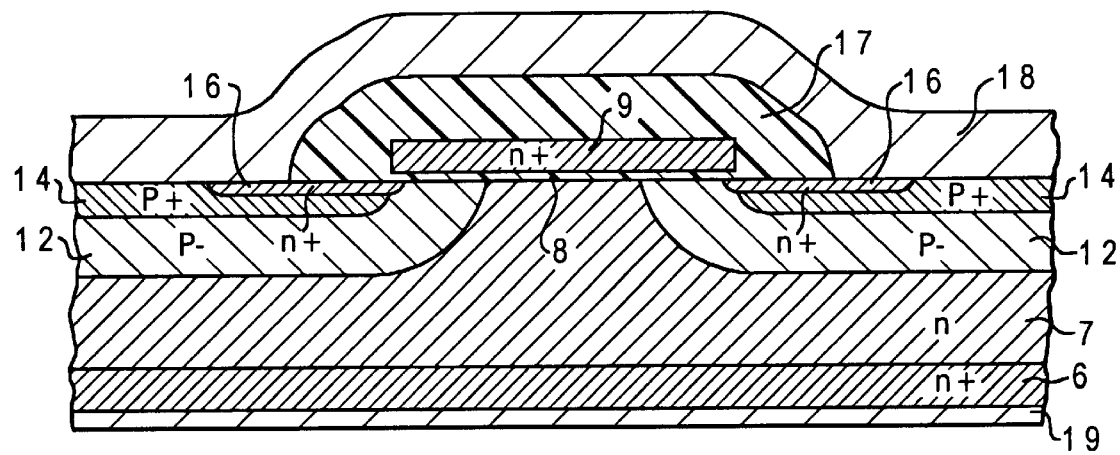
Figure 8:
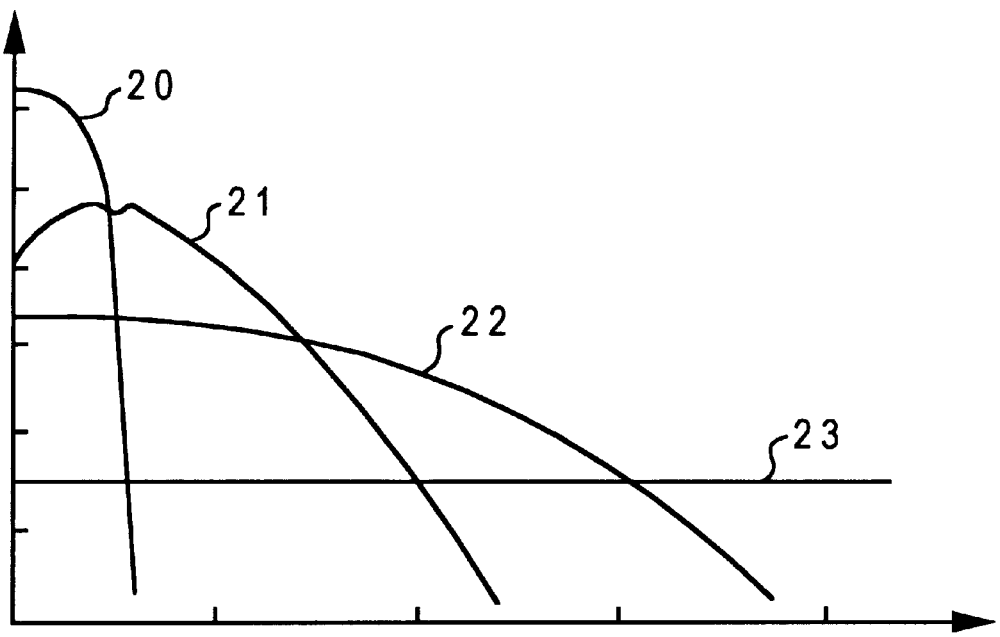
FIGS. 8 and 9 illustrate the dopant concentration profiles in the different regions of a power MOS transistor accomplished according to FIGS. 1–5 and 6–7A–7B, respectively.

Referring to FIG. 5, the polycrystalline silicon gate 9 is then covered with an insulating layer 17. After the formation of contact areas, metallization is formed on the front and rear of the device, indicated as regions 18 and 19. The resulting structure is an MOS type power transistor with a vertical current flow. Highly doped body regions 14 are contained inside lightly doped body regions 12 and self-aligned with gate 9. Possible concentration profiles of the various layers of the transistor are illustrated in the diagram of FIG. 8. In FIG. 8, the x-axis gives approximate junction depths, in microns, starting from the surface and the y-axis gives the log values of the dopant concentration in atoms/cm$^3$.

Curve 20 represents the concentration of arsenic in the source region 16. Curve 21 represents the concentration of boron in the highly doped body regions 14. Curve 22 represents the concentration of boron in the lightly doped regions 12. Curve 23 represents the concentration of phosphorous in the epitaxial layer 7. In all cases the curves 20–23 are proportional to the logarithm of the concentrations of the various dopants. Consistent with FIGS. 1–5, the curves of FIG. 8 indicate that the junction depth of the highly doped regions 14 is less than that of the lightly doped regions 12.

Figure 6:
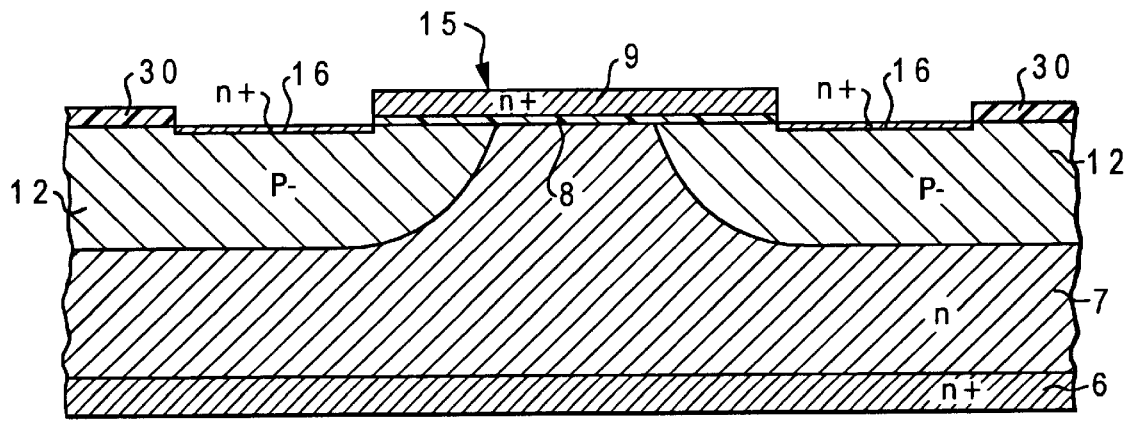
FIGS. 6 and 7A–7B illustrate steps which are alternative to those illustrated in FIGS. 3 and 4.
Figure 7A:
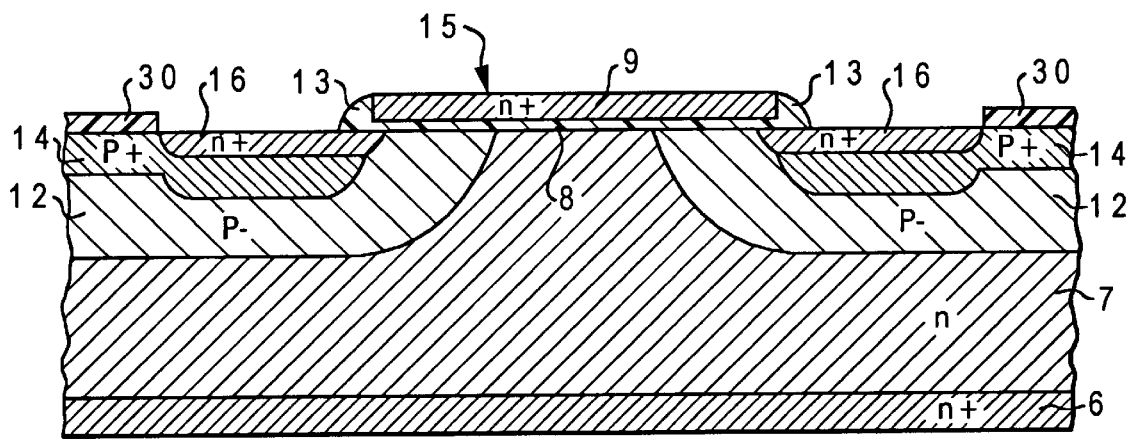
Figure 7B:
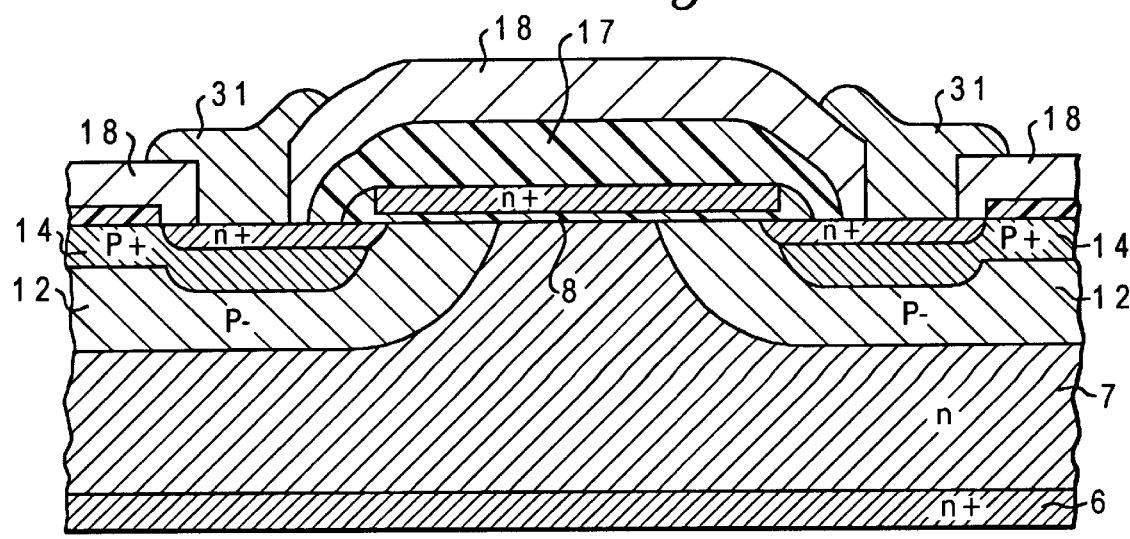

Referring to FIGS. 6 and 7A–7B an alternative process for forming transistors is illustrated. FIG. 6 illustrates process steps taken after implantation and diffusion of the lightly doped regions 12 as described in connection with FIG. 2. Therefore, FIGS. 6 and 7A–7B indicate alternative process steps substituted for those described in connection with FIGS. 3 and 4.

Referring to FIG. 6, after formation of the lightly doped regions 12, oxide layer 30 is formed as described above, and source regions 16 are implanted. Referring to FIG. 7A, spacers 13 are formed, followed by implantation of the highly doped regions 14. The source region 16 and highly doped regions 14 are then simultaneously diffused, followed by removal of the spacers 13. The remaining process steps described in connection with FIG. 5 are then performed, resulting in a transistor similar to that shown in FIG. 5 as illustrated in FIG. 7B. Metal contacts 31 may then be formed to source regions 16 through insulating layer 18.

Figure 9:
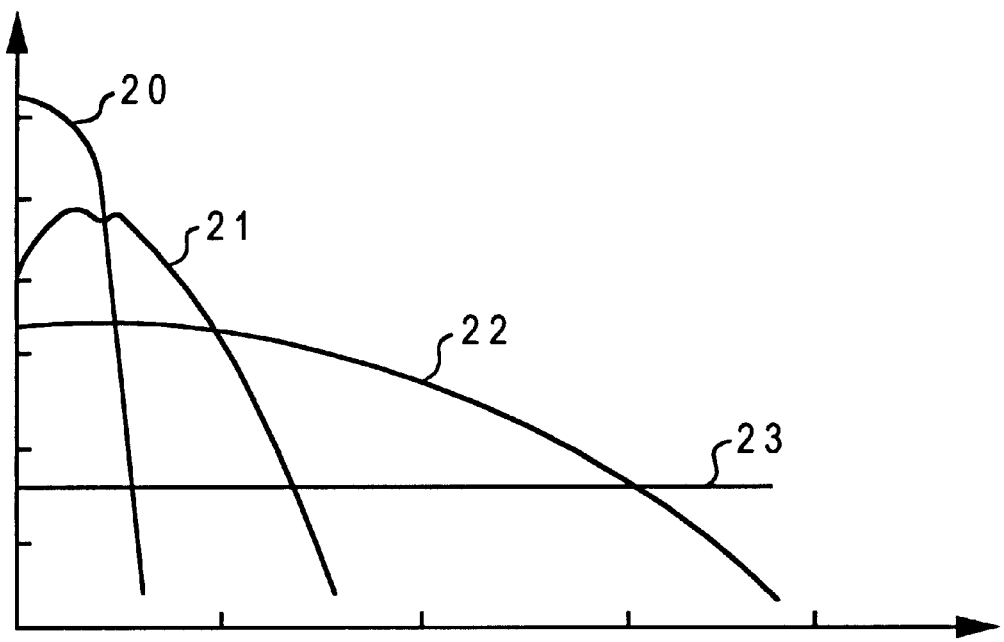

FIG. 9 illustrates a concentration/depth diagram obtained using the alternative technique described in connection with FIGS. 6 and 7. As can be seen from FIG. 9, the junction depth of the highly doped regions 14 is even less than that obtained with process of FIGS. 1–5.

In the drawings, references were made to the formation of n-channel transistors. It will be apparent to those skilled in the art that the processes described above can also be used to form p-channel KOS transistors.

Moreover, such a process, although described for discrete devices, can also be applied to integrated devices. One example of such an integrated device is a monolithic circuit containing both a control circuit and a power stage.

While the invention has been particularly shown and described with reference to a preferred embodiment, it will be understood by those skilled in the art that various changes in form and detail may be made therein without departing from the spirit and scope of the invention.

What is claimed is:

1. A semiconductor transistor structure, comprising:
   an epitaxial semiconductor layer;
   a gate insulating layer overlying a portion of the epitaxial semiconductor layer;
   a gate conductor overlying the gate insulating layer;
   a lightly doped region of a first conductivity type within the epitaxial semiconductor layer and extending under the rate conductor;
   a heavily doped region of the first conductivity type within the epitaxial semiconductor layer and contained within the lightly doped region; and
   a source region of a second conductivity type within the epitaxial semiconductor layer adjacent to the gate conductor, wherein the heavily doped region is deeper under said source region than in all locations not under said source region.

2. The transistor structure of claim 1, wherein said heavily doped region is wholly contained within said lightly doped region.

3. The transistor structure of claim 1, wherein said gate insulating layer comprises oxide.

4. The transistor structure of claim 1, wherein said gate conductor comprises polycrystalline silicon.

5. The transistor structure of claim 4, wherein said polycrystalline silicon is highly doped to improve conductivity.

6. The transistor structure of claim 1, further comprising:
   a protective insulating layer over said gate conductor; and
   conductive contacts to said source region.

7. The transistor structure of claim 6, further comprising:
   a highly doped semiconductor substrate of the first conductivity type underlying said epitaxial semiconductor layer; and
   a conductive contact to said semiconductor substrate.

8. The transistor structure of claim 7, wherein said contacts to said source region and to said substrate comprise metal contacts.

9. The transistor structure of claim 1, wherein the first conductivity type is n-type, and the second conductivity type is p-type.

10. The transistor structure of claim 1, wherein the first conductivity type is p-type, and the second conductivity type is n-type.

11. A semiconductor transistor structure, comprising:
    a semiconductor substrate;
    an epitaxial semiconductor layer overlying the semiconductor substrate;
    a gate insulating layer overlying a portion of the epitaxial semiconductor layer;
    a gate conductor overlying the gate insulating layer;
    a lightly doped region of a first conductivity type on the epitaxial semiconductor layer and extending under the gate conductor;
    a heavily doped region of the first conductivity type in the lightly doped region; and
    a source region of a second conductivity type different than the first conductivity type in a portion of the heavily doped region and a portion of the lightly doped region, wherein said heavily doped region is deeper under said source region than in all locations not under said source region.

12. The transistor structure of claim 11, wherein said heavily doped region is wholly contained within said lightly doped region.

13. The transistor structure of claim 11, wherein said gate insulating layer comprises oxide.

14. The transistor structure of claim 11, wherein said gate conductor comprises polycrystalline silicon.

15. The transistor structure of claim 14, wherein said polycrystalline silicon is highly doped to improve conductivity.

16. The transistor structure of claim 11, further comprising:
    a protective insulating layer over said gate conductor.

17. The transistor structure of claim 11, wherein said semiconductor substrate is highly doped.

18. The transistor structure of claim 11, further comprising:
    conductive contacts to said source region; and
    a conductive contact to said semiconductor substrate.

19. The transistor structure of claim 18, wherein said contacts to said source region and to said substrate comprise metal contacts.

20. The transistor structure of claim 11, wherein the first conductivity type is N-type and the second conductivity type is P-type.

21. The transistor structure of claim 11, wherein the first conductivity type is P-type and the second conductivity type is N-type.

22. A power MOS transistor with vertical current flow, comprising:
    a silicon substrate having a high concentration of dopant of a first conductivity type;
    an epitaxial layer with a low concentration of dopant of the first conductivity type on the substrate;
    a gate oxide layer on a surface portion of the epitaxial layer;
    a polycrystalline silicon gate layer on the gate oxide layer;
    lightly doped regions with a dopant of a second conductivity type formed in the epitaxial layer adjacent to and partially below the surface portion of the epitaxial layer beneath the gate oxide layer;
    heavily doped regions with a dopant of the second conductivity type formed in the lightly doped body regions aligned with the gate layer; and
    source regions with a dopant of the first conductivity type formed in portions of the heavily doped body regions, wherein said heavily doped body regions are deeper under said source regions than in all locations not under said source regions.

23. The power MOS transistor of claim 22, wherein said heavily doped body regions are wholly contained within said lightly doped body regions.

* * * * *